US008191217B2

(12) United States Patent
Dunn et al.

(10) Patent No.: US 8,191,217 B2
(45) Date of Patent: Jun. 5, 2012

(54) COMPLIMENTARY METAL-INSULATOR-METAL (MIM) CAPACITORS AND METHOD OF MANUFACTURE

(75) Inventors: James S. Dunn, Jericho, VT (US); Zhong-Xiang He, Essex Junction, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 399 days.

(21) Appl. No.: 12/535,769

(22) Filed: Aug. 5, 2009

(65) Prior Publication Data

US 2011/0032659 A1 Feb. 10, 2011

(51) Int. Cl.
*H01G 7/00* (2006.01)

(52) U.S. Cl. ........ 29/25.42; 29/25.41; 29/847; 438/240; 438/254

(58) Field of Classification Search .................. 29/25.41, 29/25.42, 830, 847; 257/296, 303, 310, 532; 361/301.1, 301.4, 306.3, 312, 313; 438/239, 438/240, 253, 254
See application file for complete search history.

(56) References Cited

U.S. PATENT DOCUMENTS

| 6,271,084 | B1* | 8/2001 | Tu et al. ........................ 438/253 |
| 6,677,254 | B2 | 1/2004 | Narwankar et al. |
| 6,730,573 | B1 | 5/2004 | Ng et al. |
| 6,885,056 | B1 | 4/2005 | Dornisch et al. |
| 6,919,283 | B2 | 7/2005 | Joshi |
| 6,998,322 | B2 | 2/2006 | Das et al. |
| 7,008,841 | B2 | 3/2006 | Kim et al. |
| 7,312,118 | B2 | 12/2007 | Kiyotoshi |
| 2002/0182794 | A1* | 12/2002 | Ning et al. ..................... 438/200 |
| 2003/0030084 | A1* | 2/2003 | Moise et al. ................... 257/295 |
| 2004/0251514 | A1* | 12/2004 | Abadeer et al. ............... 257/532 |
| 2005/0006687 | A1* | 1/2005 | Dirnecker et al. ............ 257/303 |
| 2005/0132549 | A1 | 6/2005 | Shih et al. |
| 2005/0272219 | A1* | 12/2005 | Coolbaugh et al. ........... 438/396 |
| 2006/0158829 | A1 | 7/2006 | Kwon et al. |
| 2006/0183280 | A1* | 8/2006 | Lee et al. ....................... 438/239 |
| 2006/0286734 | A1 | 12/2006 | Mussig et al. |
| 2007/0057343 | A1* | 3/2007 | Chinthakindi et al. ....... 257/532 |
| 2007/0202656 | A1 | 8/2007 | Park et al. |
| 2008/0020540 | A1 | 1/2008 | Takeda et al. |
| 2009/0200638 | A1* | 8/2009 | Smith ........................... 257/532 |

* cited by examiner

*Primary Examiner* — A. Dexter Tugbang
*Assistant Examiner* — Jeffrey T Carley
(74) *Attorney, Agent, or Firm* — Anthony Canale; Roberts Mlotkowski Safran & Cole, P.C.

(57) ABSTRACT

A high density capacitor and low density capacitor simultaneously formed on a single wafer and a method of manufacture is provided. The method includes depositing a bottom plate on a dielectric material; depositing a low-k dielectric on the bottom plate; depositing a high-k dielectric on the low-k dielectric and the bottom plate; depositing a top plate on the high-k dielectric; and etching a portion of the bottom plate and the high-k dielectric to form a first metal-insulator-metal (MIM) capacitor having a dielectric stack with a first thickness and a second MIM capacitor having a dielectric stack with a second thickness different than the first thickness.

8 Claims, 5 Drawing Sheets

COMPLIMENTARY METAL-INSULATOR-METAL (MIM) CAPACITORS AND METHOD OF MANUFACTURE

FIELD OF THE INVENTION

The invention relates to complimentary metal-insulator-metal (MIM) capacitors and a method of manufacture and, more particularly, to a high density capacitor and low density capacitor formed simultaneously on a single wafer and a method of manufacture.

BACKGROUND

Metal-insulator-metal (MIM) capacitors are valuable components in memory, logic and analog circuits. For example, MIM capacitors are critical in several mixed signal integrated circuits such as analog frequency tuning circuits, switched capacitor circuits, filters, resonators, up-conversion and down-conversion mixers, and A/D converters.

MIM capacitors are developed with the highest capacitance consistent with the operating voltage. For example, in older CMOS/SiGe generations, the maximum use voltage was 6.5V which has migrated to 5V and 3.3V for newer generations. However, as GaAs chip designs have been migrating into SiGe and RF-CMOS, the need for both high capacitance and high operating voltage MIM capacitors has arisen. As such, different types of MIM capacitors may be needed for different circuit requirements. As an example, low density (high voltage) capacitors are required for power amplifier applications and ADC/DAC converters; whereas, high density capacitors are required for RF filter/coupling and decoupling capacitors. High quality factor (Q) capacitors may also be needed for RF switching. For this reason, there is a need to have MIM capacitors to address different circuit design requirements. However, there is no known economical way to manufacture complimentary MIM capacitors on a single chip to address different circuit design requirements.

Accordingly, there exists a need in the art to overcome the deficiencies and limitations described hereinabove.

SUMMARY

In a first aspect of the invention, a method includes: depositing a bottom plate on a dielectric material; depositing a low-k dielectric on the bottom plate; depositing a high-k dielectric on the low-k dielectric and the bottom plate; depositing a top plate on the high-k dielectric; and etching a portion of the bottom plate and the high-k dielectric to form a first metal-insulator-metal (MIM) capacitor having a dielectric stack with a first thickness and a second MIM capacitor having a dielectric stack with a second thickness different than the first thickness.

In another aspect of the invention, a method of forming complimentary metal-insulator-metal (MIM) capacitors comprises forming a high density capacitor and a low density capacitor on a same level. The high density capacitor and low density capacitor both have a bottom plate, a top plate and a high-k dielectric each deposited in a same processing step.

In yet another aspect of the invention, a structure comprises complimentary metal-insulator-metal (MIM) capacitors on a same wiring level on a substrate, wherein a first of the MIM capacitors comprises a first dielectric stack having a first thickness and a second of the MIM capacitors comprises a second dielectric stack having a second thickness different than the first thickness.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to complimentary metal-insulator-metal (MIM) capacitors and a method of manufacture and, more particularly, to a high density capacitor and low density capacitor simultaneously formed on a single wafer and a method of manufacture. In embodiments, the present invention comprises a plurality of MIM capacitors formed on a same wiring level, e.g., a dual dielectric MIM capacitor, using a high-K dielectric stack for a high capacitance (high density) capacitor and a low-k dielectric stack for a low capacitance (low density) capacitor. For example, in a specific embodiment, the structure includes a dual plate capacitor using the same top and bottom metal plates, where the first of the MIM capacitors includes a first dielectric stack having a first thickness and a second of the MIM capacitors includes a second dielectric stack having a second thickness different than the first thickness. In embodiments, the first dielectric stack includes a high-k dielectric and the second dielectric stack includes a low-k dielectric. Advantageously, the MIM capacitors of the present invention can be formed with Cu or Al BEOL (back end of line) processes.

Figure 1:
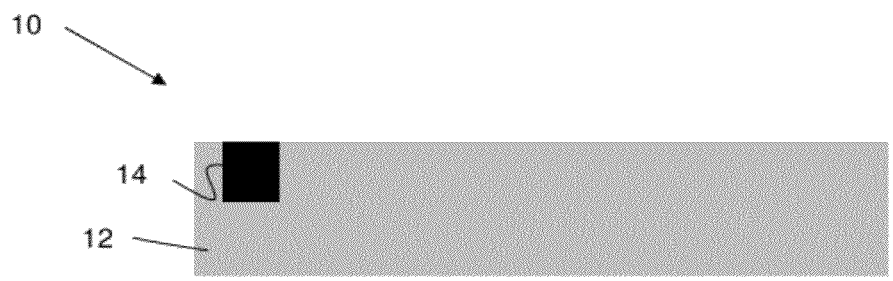
FIGS. 1-8 show structures and respective processing steps in accordance with aspects of the invention.

FIGS. 1-8 show structures and respective processing steps in accordance with aspects of the invention. Specifically, FIG. 1 shows a structure 10 comprising a wire 14 formed in a dielectric layer 12 using conventional damascene processes. In embodiments, the wire 14 is a copper or aluminum copper wire formed using conventional lithographic, etching and deposition processes such that no further explanation is required herein for those of skill in the art to understand the invention. The wire 14 may be about 0.5 to 1.0 micron in height; although other dimensions are also contemplated by the invention. The dielectric layer 12 can be any dielectric such as, for example, USG, FSG, or SiCOH.

Figure 2:
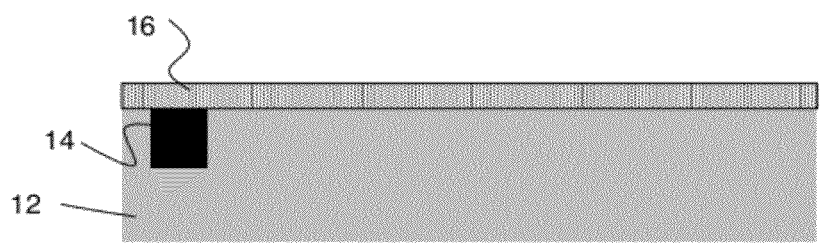

Referring to FIG. 2, a dielectric layer 16 is formed on the structure of FIG. 1. In particular, the dielectric layer 16 is deposited on the wire 14 and the dielectric layer 12 using conventional deposition processes such as, for example, high density plasma chemical vapor deposition (CVD) or PECVD processes. The deposition process, in embodiments, can be a two step process, depositing material such as, for example, SiN and $SiO_2$ or SiCN and $SiO_2$. In embodiments, the dielectric layer 16 can be about 500 Å thick; although other dimensions are also contemplated by the invention such as ranging from about 100 nm to 300 nm.

Figure 3:
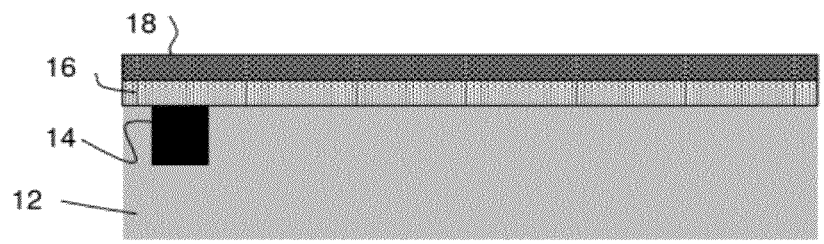

In FIG. 3, a metal plate 18 is formed on the dielectric layer 16. In embodiments, the metal plate 18 will form a bottom plate of two complimentary MIM capacitors. The metal plate 18 can be deposited using conventional sputtering techniques to a thickness of about 50 nm to about 3000 Å; although other dimensions are also contemplated by the present invention. In embodiments, the metal plate 18 is a refractory metal such as, for example, TiN, Tungsten or Tantalum or combinations such as, for example, TiN/W/TiN, TiN/AlCu/TiN or TaN/Ta/TiN.

Figure 4:
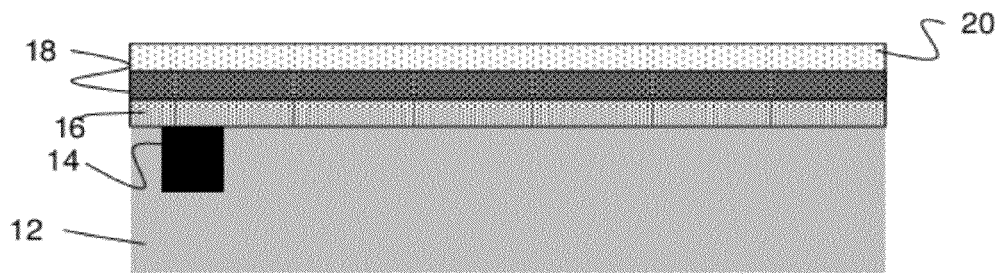

As shown in FIG. 4, a low-k dielectric 20 is deposited on the metal plate 18. The low-k dielectric 20 can have a dielectric constant of about 10 or less. The low-k dielectric can be, for example, $SiO_2$ or SiN. In embodiments, the low-k dielectric 20 can be deposited using any conventional deposition techniques such as, for example, CVD or PECVD. In one contemplated embodiment, the low-k dielectric 20 is $SiO_2$ deposited to a thickness of about 100 nm, using low temperature methods known in the art (e.g., PECVD at about 350° C. or 400° C.) to achieve a 100V breakdown. Those of skill in the art should appreciate, though, that the dimensions of the low-k dielectric 20 can vary such as, for example, from about 50 nm to about 1000 nm, in certain embodiments.

Figure 5:
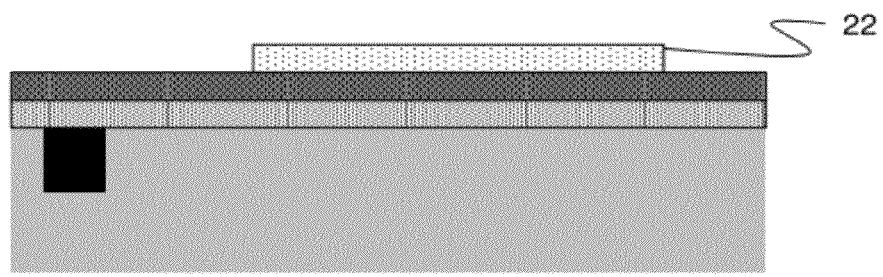

In FIG. 5, portions of the low-k dielectric 20 are removed to form an island 22. In embodiments, the portions of the low-k dielectric 20 can be removed by a conventional lithographic and etching process. More specifically, in embodiments, the low-k dielectric 20 can be lithographically patterned and removed to form a 2 micron wide and about 50 nm to about 1000 nm high island 22. The removal process may use, for example, a wet chemical etch, such as 100:1 DHF. In embodiments, the island 22 (e.g., portions of the remaining low-k dielectric material) is provided in a location where low MIM capacitance per unit area is desired with sufficient border in areas away from the MIM top plate (e.g. about 1 um); whereas, the low-k dielectric 20 is removed where a high-k MIM capacitor will be formed, as discussed in more detail below. It should be understood that the low-k dielectric 20 can also be left or removed in areas where there will be no MIM formation.

Figure 6:
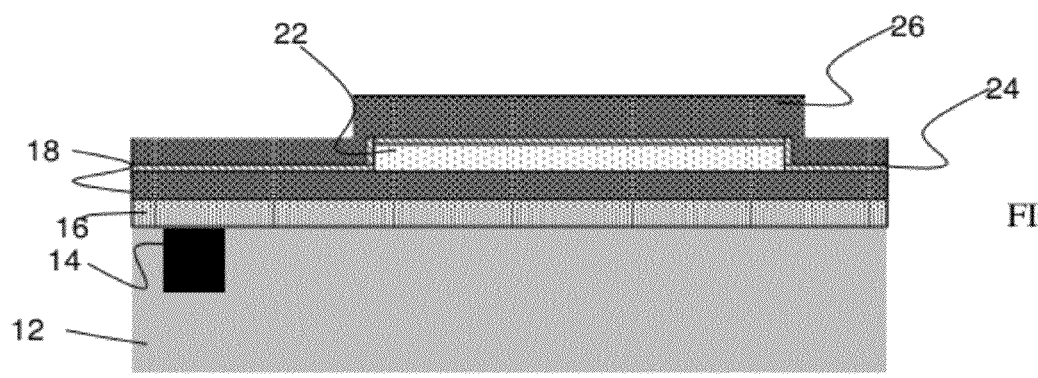

In FIG. 6, a high-k dielectric 24 is conformally deposited on the structure of FIG. 5. In embodiments, the high-k dielectric 24 has a dielectric constant greater than 20. The high-k dielectric 24 can be, for example, $ZrO_2$, $Ta_2O_5$, $HfO_2$, or a composite film such as any of $ZrO_2/Al_2O_3/ZrO_2$. The high-k dielectric 24 can have a thickness of about 300 Å; although other dimensions are contemplated by the present invention. A metal plate 26 is then deposited on the high-k dielectric 24. The metal plate 26 can be deposited using conventional sputtering techniques. In embodiments, the metal plate 26 can have a thickness of about 50 nm to about 3000 Å; although other dimensions are also contemplated by the present invention. The metal plate 26 can be a refractory metal such as, for example, TiN, Tungsten or Tantalum or combinations such as, for example, TiN/W/TiN, TiN/AlCu/TiN or TaN/Ta/TiN.

Figure 7:
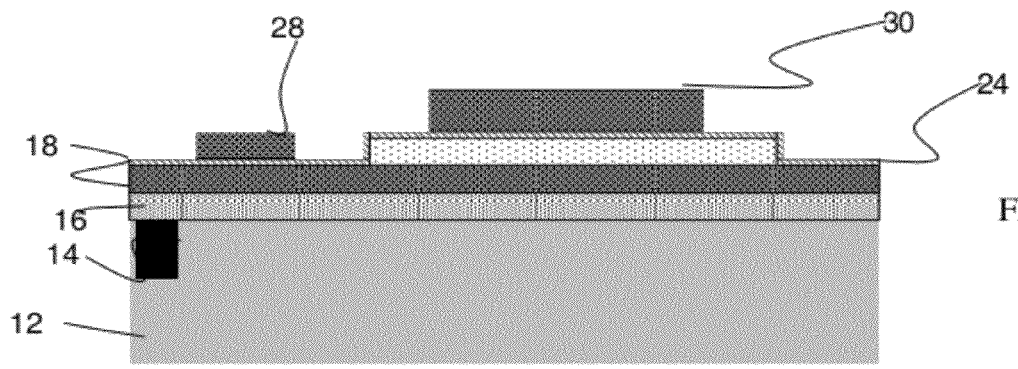

As seen in FIG. 7, the metal plate 26 is etched to form islands 28, 30, respectively. In this way, the metal plate 26 can be used as a top plate for a first MIM capacitor and a top plate for a second MIM capacitor. In embodiments, the first MIM capacitor will be a high density MIM capacitor and the second MIM capacitor will be a low density MIM capacitor, e.g., using the low-k dielectric material.

Figure 8:
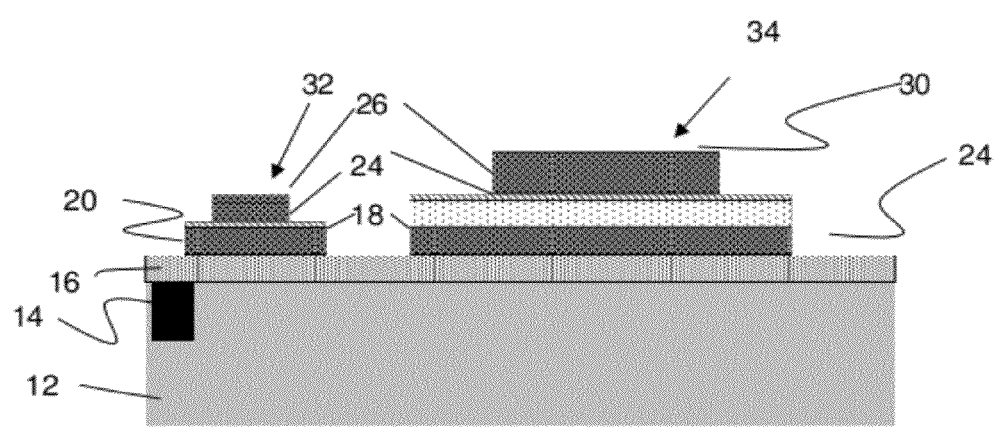

FIG. 8 shows further processing steps to form a two plate dual dielectric material MIM capacitors, i.e., a high density MIM capacitor 32 and a low density MIM capacitor 34. More specifically, the structure of FIG. 7 is selectively etched to form the high density MIM capacitor 32 and the low density MIM capacitor 34. The selective etching will remove exposed portions of the high-k dielectric 24 on the metal plate 18 and low-k dielectric 20, as well as provide a separation between the high density MIM capacitor 32 and the low density MIM capacitor 34 by etching the metal plate 18 therebetween. In this way, in embodiments, the high density MIM capacitor 32 comprises the metal plate 18, high-k dielectric 24 and top metal plate 26 (e.g., island 28). On the other hand, the low density MIM capacitor 34 comprises the metal plate 18, low-k dielectric 20 (e.g., island 22), high-k dielectric 24, and top metal plate 26 (island 28). Thus, a first MIM capacitor has a dielectric stack with a first thickness and a second MIM capacitor has a dielectric stack with a second thickness different than the first thickness.

Figure 9:
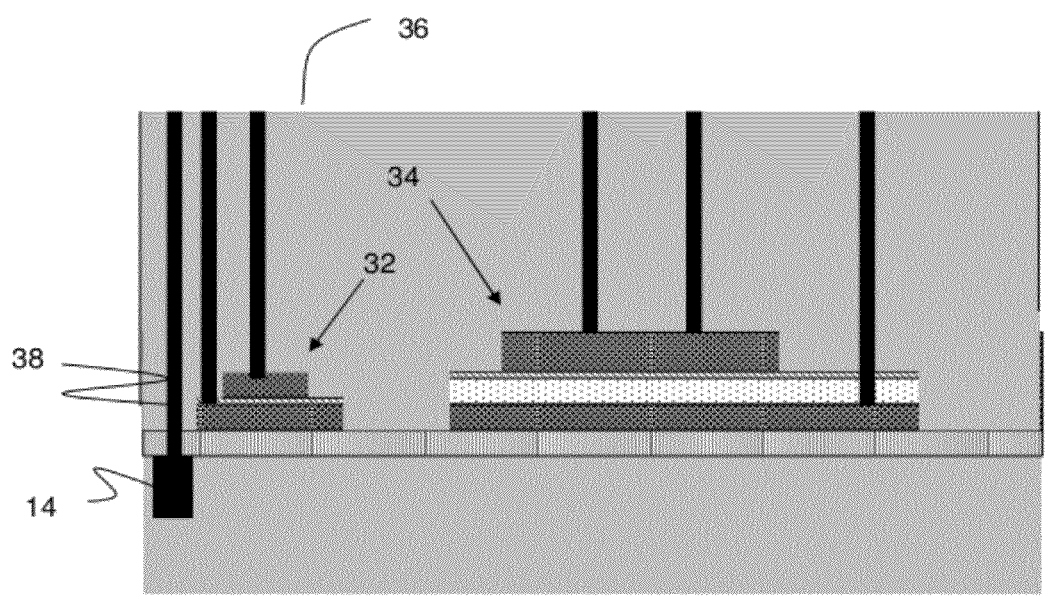
FIG. 9 shows a final structure and respective processing steps in accordance with aspects of the invention.

FIG. 9 shows further processes steps and a final structure in accordance with the invention. Those of skill in the art will realize, though, that the structure of FIG. 8 may also be considered the final structure. In the structure of FIG. 9, a dielectric layer 36 (e.g., ILD) can be deposited on the structure of FIG. 8. Contacts 38 are formed in the dielectric layer 36 and in contact with the wire 24, the high density MIM capacitor 32 and the low density MIM capacitor 34. The contacts 38 can be formed using conventional lithographic, etching a deposition methods known to those of skill in the art such that no further explanation is required herein.

In one specific embodiment, the final structure includes a coplanar high-k dielectric MIM (high density MIM capacitor 32) and high-k and low-k dielectric MIM (low density MIM capacitor). In one illustrative example, a high-k dielectric with a capacitance density of 6 $fF/um^2$ and a $SiO_2$ dielectric with a capacitance density of 0.7 $fF/um^2$ are used, then the final MIM capacitance density will be 6 fF/um2 for high capacitance density MIIM (high density MIM capacitor 32) and 0.63 fF/um2 for low capacitance density MIM (low density MIM capacitor 34). However, it should be understood that the above is merely one illustrative example that should not be considered a limiting feature. In fact, is should be understood by those of skill in the art that specifying low-k dielectric (e.g., SiN or SiO) thickness can be specified for varying breakdown voltage and high-k dielectric thickness can be specified for specific capacitance density.

Figure 10:
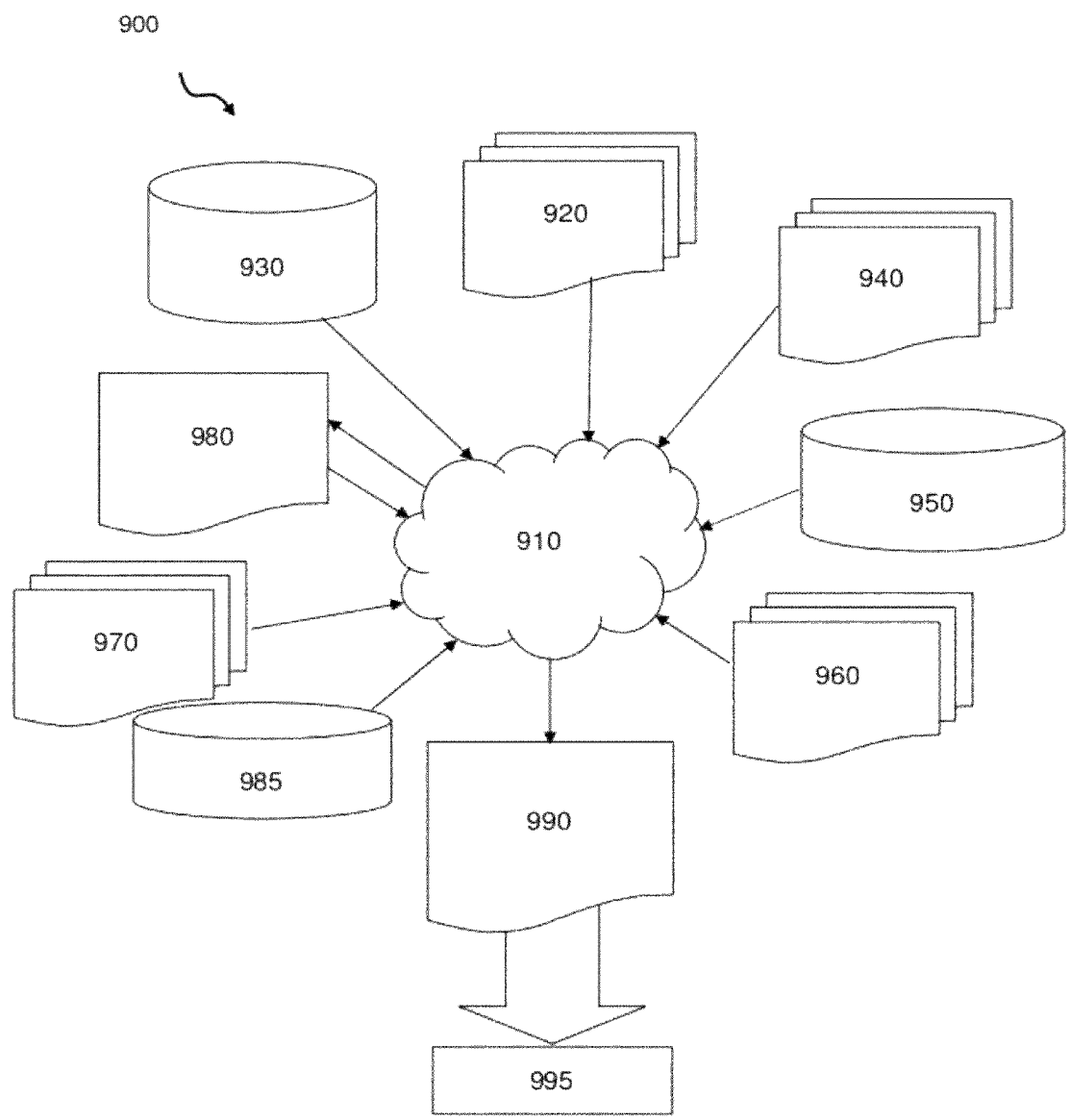
FIG. 10 is a flow diagram of a design process used in semiconductor design, manufacture, and/or test.

FIG. 10 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIG. 9, for example. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIG. 9, for example. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 9, for example, to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 9, for example. In one embodiment, design structure 990 may comprise a compiled, executable HDL simulation model that functionally simulates the devices shown in FIG. 9, for example.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 9, for example. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A method comprising:
   depositing a bottom plate on a dielectric material;
   depositing a low-k dielectric on the bottom plate;
   depositing a high-k dielectric on the low-k dielectric and the bottom plate;
   depositing a top plate on the high-k dielectric; and
   etching a portion of the bottom plate and the high-k dielectric to form a first metal-insulator-metal (MIM) capacitor having a dielectric stack with a first thickness and a second MIM capacitor having a dielectric stack with a second thickness different than the first thickness.

2. The method of claim 1, further comprising patterning and removing a portion of the low-k dielectric where the second MIM capacitor is formed, prior to the depositing of the high-k dielectric.

3. The method of claim 1, wherein the top plate is patterned and etched to form two islands of metal material used for both the first MIM capacitor and the second MIM capacitor.

4. The method of claim 1, wherein the first MIM capacitor includes the low-k dielectric and the high-k dielectric.

5. The method of claim 4, wherein the second MIM capacitor is devoid of the low-k dielectric and includes the high-k dielectric.

6. The method of claim 1, further comprising forming a wiring layer below the first MIM capacitor and the second MIM capacitor, and forming a contact to the wiring layer on a side of the second MIM capacitor.

7. The method of claim 1, further comprising forming contacts to the first MIM capacitor and the second MIM capacitor.

8. The method of claim 1, wherein the first MIM capacitor includes the bottom plate, the low-k dielectric, the high-k dielectric and the top plate and the second MIM capacitor includes the bottom plate, the high-k dielectric and the top plate.

* * * * *